US012074516B2

(12) United States Patent
Akashi et al.

(10) Patent No.: US 12,074,516 B2
(45) Date of Patent: Aug. 27, 2024

(54) CLASS-D POWER CONVERTER

(71) Applicant: Panasonic Intellectual Property Management Co., Ltd., Osaka (JP)

(72) Inventors: Hiroki Akashi, Osaka (JP); Takuya Ishii, Osaka (JP); Yoshihito Kawakami, Osaka (JP); Kazuhiro Yahata, Osaka (JP); Takeshi Azuma, Osaka (JP); Yoshihisa Minami, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 161 days.

(21) Appl. No.: 17/758,404

(22) PCT Filed: Dec. 17, 2020

(86) PCT No.: PCT/JP2020/047191
§ 371 (c)(1),
(2) Date: Jul. 6, 2022

(87) PCT Pub. No.: WO2021/153072
PCT Pub. Date: Aug. 5, 2021

(65) Prior Publication Data
US 2023/0024780 A1 Jan. 26, 2023

(30) Foreign Application Priority Data
Jan. 31, 2020 (JP) .................................. 2020-014717

(51) Int. Cl.
*H02M 3/156* (2006.01)
*H02M 1/08* (2006.01)
*H03F 3/217* (2006.01)

(52) U.S. Cl.
CPC ............. *H02M 3/156* (2013.01); *H02M 1/08* (2013.01); *H03F 3/217* (2013.01)

(58) Field of Classification Search
CPC .... H02M 3/156; H02M 3/1557; H02M 3/158; H02M 3/137; H02M 3/33523;
(Continued)

(56) References Cited

U.S. PATENT DOCUMENTS

2009/0174353 A1   7/2009   Nakamura et al.
2011/0234176 A1   9/2011   Nakamura et al.
(Continued)

FOREIGN PATENT DOCUMENTS

JP   2005-304218 A   10/2005
JP   2009-130967     6/2009
(Continued)

OTHER PUBLICATIONS

International Search Report of PCT application No. PCT/JP2020/047191 dated Mar. 9, 2021.

*Primary Examiner* — Nguyen Tran
(74) *Attorney, Agent, or Firm* — Rimon P.C.

(57) ABSTRACT

A switch circuit is configured of a first semiconductor element and a second semiconductor element connected in series, and receives a DC voltage of 100 V or more. The drive circuit causes the first semiconductor element or the second semiconductor element to perform a switching operation. The isolated power supply circuit converts a predetermined power supply voltage into an isolated first power supply voltage, and outputs the first power supply voltage to the drive circuit. The isolation signal converter converts a first signal of 6 MHz or more into an isolated first drive signal, and outputs the first drive signal to the drive circuit. The single substrate mounts the isolated power supply circuit and the isolation signal converter. Both the
(Continued)

first semiconductor element and the second semiconductor element are wide bandgap semiconductor elements.

18 Claims, 9 Drawing Sheets

(58) Field of Classification Search
CPC . H02M 3/3353; H02M 3/33553; H03F 3/217; H03F 3/2171; H03F 3/2173
See application file for complete search history.

(56) References Cited

U.S. PATENT DOCUMENTS

| | | |
|---|---|---|
| 2015/0137871 A1 | 5/2015 | Takano |
| 2016/0087623 A1 | 3/2016 | Yamaguchi et al. |
| 2016/0218634 A1* | 7/2016 | Du .................... H02M 3/33546 |
| 2017/0179814 A1 | 6/2017 | Hamond et al. |
| 2017/0257022 A1 | 9/2017 | Bryant |
| 2018/0248540 A1 | 8/2018 | Ishii et al. |
| 2020/0220489 A1 | 7/2020 | Nakamura et al. |
| 2022/0139797 A1* | 5/2022 | Takahashi ............ H01L 25/072 257/712 |
| 2023/0421050 A1* | 12/2023 | Ishikawa ................ H04L 25/02 |

FOREIGN PATENT DOCUMENTS

| | | |
|---|---|---|
| JP | 2011-205746 | 10/2011 |
| JP | 2016-066852 | 4/2016 |
| JP | 2017-536078 | 11/2017 |
| JP | 2018-521626 A | 8/2018 |
| WO | 2014/196136 A1 | 12/2014 |
| WO | 2017/081856 | 5/2017 |
| WO | 2019/059292 | 3/2019 |

* cited by examiner

CLASS-D POWER CONVERTER

FIELD OF THE INVENTION

The present disclosure relates to a class-D power converter that switches an input DC voltage and outputs the input DC voltage being switched.

DESCRIPTION OF THE RELATED ART

Conventionally, a class-D power converter using a silicon semiconductor element as a switching element has been known (see, for example, PTL 1). Further, a switching element using a gallium nitride (GaN) transistor is disclosed in PTL 2.

CITATION LIST

Patent Literature

PTL 1: Unexamined Japanese Patent Publication No. 2011-205746
PTL 2: WO 2017/081856 A

SUMMARY OF THE INVENTION

A class-D power converter capable of performing a stable high-frequency switching operation while being small is required.

A class-D power converter according to an aspect of the present disclosure includes a switch circuit, a drive circuit, an isolated power supply circuit, an isolation signal converter, and a single substrate. The switch circuit includes a first semiconductor element and a second semiconductor element. Further, the switch circuit receives a DC voltage of 100 V or more. The first semiconductor element and the second semiconductor element are connected in series with each other. The drive circuit causes the first semiconductor element or the second semiconductor element to perform a switching operation. A predetermined power supply voltage is input to the isolated power supply circuit. The isolated power supply circuit converts the predetermined power supply voltage into a first power supply voltage isolated from the predetermined power supply voltage. Further, the isolated power supply circuit outputs the first power supply voltage to the drive circuit. The isolation signal converter receives a first signal of 6 MHz or more. The isolation signal converter converts the first signal into a first drive signal isolated from the first signal. Further, the isolation signal converter outputs the first drive signal to the drive circuit. The single substrate mounts the isolated power supply circuit and the isolation signal converter. Both the first semiconductor element and the second semiconductor element are wide bandgap semiconductor elements. The class-D power converter changes a potential at a connection point between the first semiconductor element and the second semiconductor element at a maximum speed of 50 V/ns or more, and outputs an AC voltage having a power of 1 kW or more from the connection point.

A class-D power converter according to another aspect of the present disclosure includes a switch circuit, a drive circuit, an isolated power supply circuit, and an isolation signal converter. The switch circuit includes a first semiconductor element and a second semiconductor element connected in series with each other. Further, the switch circuit receives a DC voltage of 100 V or more. The drive circuit causes the first semiconductor element or the second semiconductor element to perform a switching operation. A predetermined power supply voltage is input to the isolated power supply circuit. The isolated power supply circuit converts the predetermined power supply voltage into a first power supply voltage isolated from the predetermined power supply voltage. Further, the isolated power supply circuit outputs the first power supply voltage to the drive circuit. The isolation signal converter receives a first signal of 6 MHz or more. The isolation signal converter converts the first signal into a first drive signal isolated from the first signal. Further, the isolation signal converter outputs the first drive signal to the drive circuit. The drive circuit includes a first drive circuit and a second drive circuit. The first drive circuit causes the first semiconductor element to perform a switching operation. The second drive circuit causes the second semiconductor element to perform a switching operation. The isolated power supply circuit includes a first isolated power supply circuit and a second isolated power supply circuit. A predetermined power supply voltage is input to the first isolated power supply circuit. The first isolated power supply circuit converts the predetermined power supply voltage into a first power supply voltage isolated from the predetermined power supply voltage. Further, the first isolated power supply circuit outputs the first power supply voltage to the first drive circuit. A predetermined power supply voltage is input to the second isolated power supply circuit. The second isolated power supply circuit converts the predetermined power supply voltage into a second power supply voltage isolated from the predetermined power supply voltage. Further, the second isolated power supply circuit outputs the second power supply voltage to the second drive circuit. The isolation signal converter includes a first isolation signal converter and a second isolation signal converter. The first isolation signal converter receives the first signal. The first isolation signal converter converts the first signal into a first drive signal isolated from the first signal. Further, the first isolation signal converter outputs the first drive signal to the first drive circuit. The second isolation signal converter receives a second signal of 6 MHz or more. The second isolation signal converter converts the second signal into a second drive signal isolated from the second signal. Further, the second isolation signal converter outputs the second drive signal to the second drive circuit. A wiring path that transmits the first power supply voltage from the first isolated power supply circuit to the first drive circuit is less than or equal to 5 cm. The first semiconductor element and the second semiconductor element are wide bandgap semiconductor elements. The class-D power converter changes a potential at a connection point between the first semiconductor element and the second semiconductor element at a maximum speed of 50 V/ns or more, and outputs an AC voltage having a power of 1 kW or more from the connection point.

According to the class-D power converter of the present disclosure, there is provided a class-D power converter capable of performing a stable high-frequency switching operation while being small.

DETAILED DESCRIPTION OF THE PREFERRED EMBODIMENTS

Figure 1:
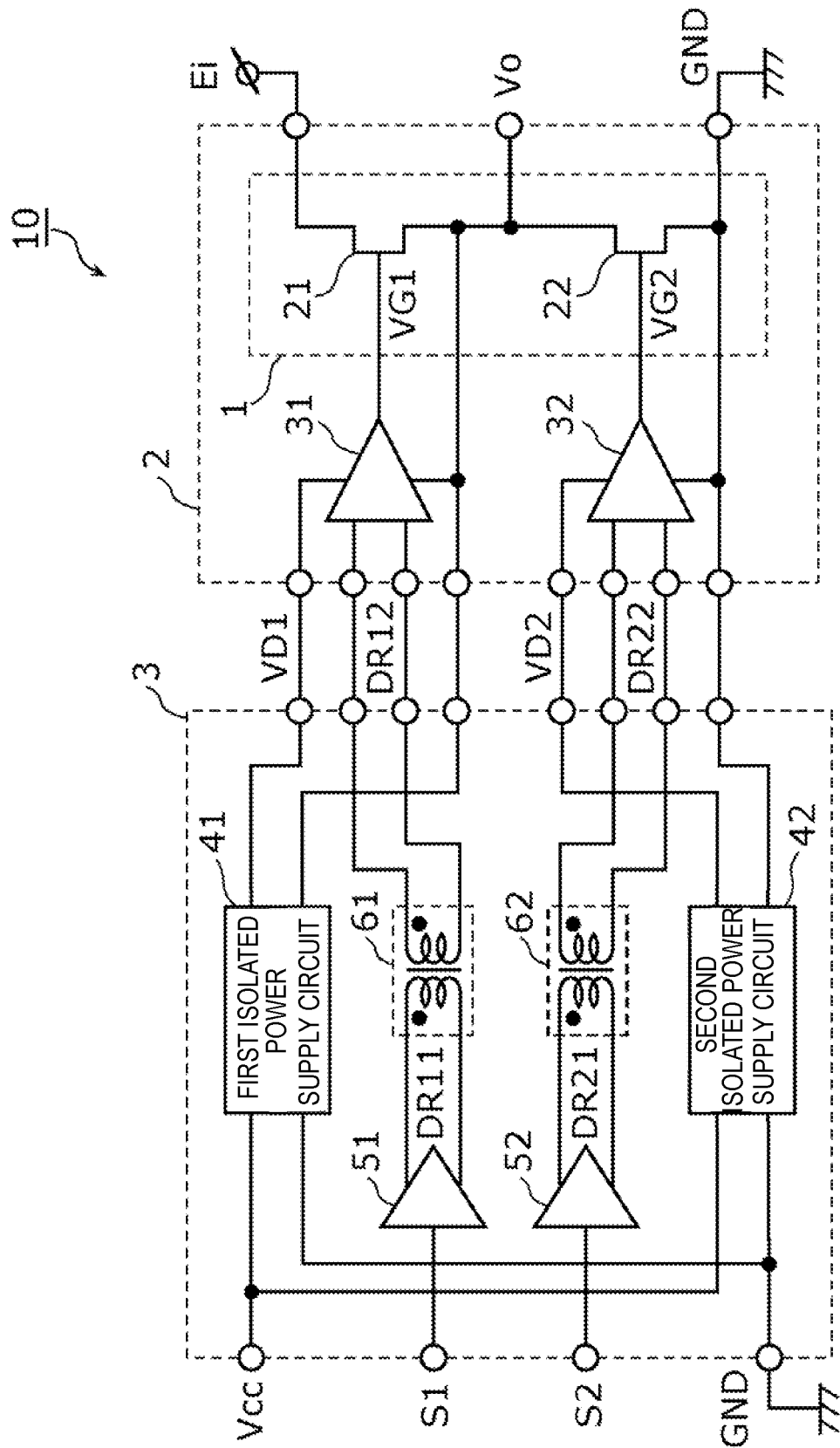
FIG. 1 is a block diagram illustrating a circuit configuration example of a class-D power converter according to a first exemplary embodiment.

Background of Obtaining One Aspect of Present Disclosure

For example, in a conventional class-D power converter disclosed in PTL 1, a silicon semiconductor element such as an insulated gate bipolar transistor (IGBT) or a metal oxide semiconductor field effect transistor (MOSFET) is used as a switching element.

A switching power supply and an inverter using the class-D power converter can be downsized as a switching frequency is higher. However, one of obstacles in increasing the switching frequency is a parasitic capacitance called an output capacitance Coss of the switching element. The time required for charging and discharging the output capacitance Coss corresponds to switching time. The larger the power of the class-D power converter, the longer the switching time since the switching element having a larger output capacitance Coss is used.

According to the investigation by the inventors, in the case of power conversion in which a DC input voltage is 100 V or more and an output power is 1 kW or more, which is relatively often required for a class-D amplifier or wireless power feeding, the minimum value of an output capacity of the silicon semiconductor element is 230 pF, and a limit of a switching speed is 30 V/ns. Furthermore, according to the study of the inventors, the switching frequency that can withstand practical use with the switching at the maximum speed of 30 V/ns is limited to 4 MHz. Here, since the output capacitance has voltage dependency, the switching speed is not always constant throughout a switching period, and is expressed as the maximum speed. In addition, subsequent specific numerical values are based on the study of the inventors in the same manner as described above.

On the other hand, it is known that further high-frequency switching is possible by using a wide bandgap semiconductor element having a small parasitic capacitance such as gallium nitride (GaN) as the switching element. The wide bandgap semiconductor includes, for example, a silicon carbide semiconductor, a diamond semiconductor, a gallium oxide semiconductor, and the like in addition to the GaN semiconductor.

The output capacitance of the wide bandgap semiconductor element is reduced to 70 pF, and a switching speed of 50 V/ns or more, for example, 95 V/ns is possible. However, when the switching frequency becomes 6 MHz or more at a switching speed of 50 V/ns or more as a maximum speed, there arises a problem that a switching operation becomes unstable due to harmonic noise (hereinafter, it is referred to as high frequency switching noise). Here, 6 MHz is a goal of our switching frequency, and even 13.56 MHz, which is also used for wireless power feeding, is also the goal of the switching frequency.

Therefore, the inventors have conducted intensive studies and experiments in order to achieve a class-D power converter that can reduce the influence of high-frequency switching noise at a switching speed of 50 V/ns or higher as a maximum speed and at a switching frequency of 6 MHz or higher and can perform a stable high-frequency switching operation while being small, with output power of 1 kW or higher at an input voltage of 100 V or higher. As a result, the inventors have arrived at a class-D power converter according to an aspect of the present disclosure.

A class-D power converter according to an aspect of the present disclosure includes a switch circuit, a drive circuit, an isolated power supply circuit, an isolation signal converter, and a single substrate. The switch circuit includes a first semiconductor element and a second semiconductor element. Further, the switch circuit receives a DC voltage of 100 V or more. The first semiconductor element and the second semiconductor element are connected in series with each other. The drive circuit causes the first semiconductor element or the second semiconductor element to perform a switching operation. A predetermined power supply voltage is input to the isolated power supply circuit. The isolated power supply circuit converts the predetermined power supply voltage into a first power supply voltage isolated from the predetermined power supply voltage. Further, the isolated power supply circuit outputs the first power supply voltage to the drive circuit. The isolation signal converter receives a first signal of 6 MHz or more. The isolation signal converter converts the first signal into a first drive signal isolated from the first signal. Further, the isolation signal converter outputs the first drive signal to the drive circuit. The single substrate mounts the isolated power supply circuit and the isolation signal converter. Both the first semiconductor element and the second semiconductor element are wide bandgap semiconductor elements. The class-D power converter changes a potential at a connection point between the first semiconductor element and the second semiconductor element at a maximum speed of 50 V/ns or more, and outputs an AC voltage having a power of 1 kW or more from the connection point.

According to the class-D power converter having the above configuration, since the isolated power supply circuit and the isolation signal converter are disposed close to each other, a power supply line of the isolated power supply circuit exerts a shielding effect on the drive signal that is a small signal, in addition to downsizing. This makes it difficult to receive harmonic switching noise generated with a high-frequency switching operation of the switch circuit. Therefore, according to the class-D power converter having the above configuration, it is possible to reduce noise superimposed on the drive signal to the switching element, contribute to miniaturization, and at the same time, perform a stable operation without malfunction.

Further, it is preferable that the drive circuit is further mounted on the single substrate.

As a result, an area and a volume of a drive system including the drive circuit occupied on the substrate can be reduced, and noise can be suppressed particularly by reducing the volume of the high-side drive system serving as a transmission unit of the high-frequency switching noise, and a stable operation without malfunction can be performed in the class-D power converter.

The drive circuit further includes a first drive circuit and a second drive circuit. The first drive circuit causes the first semiconductor element to perform a switching operation. The second drive circuit causes the second semiconductor element to perform a switching operation. The isolated power supply circuit includes a first isolated power supply circuit and a second isolated power supply circuit. A predetermined power supply voltage is input to the first isolated power supply circuit. The first isolated power supply circuit converts the predetermined power supply voltage into the first power supply voltage. Further, the first isolated power supply circuit outputs the first power supply voltage to the first drive circuit. A predetermined power supply voltage is input to the second isolated power supply circuit. The second isolated power supply circuit converts the predetermined power supply voltage into a second power supply voltage. Further, the second isolated power supply circuit outputs the second power supply voltage to the second drive circuit. The isolation signal converter includes a first isolation signal converter and a second isolation signal converter. The first isolation signal converter receives the first signal. The first isolation signal converter converts the first signal into the first drive signal. Further, the first isolation signal converter outputs the first drive signal to the first drive circuit. The second isolation signal converter receives a second signal of 6 MHz or more. The second isolation signal converter converts the second signal into a second drive signal isolated from the second signal. Further, the second isolation signal converter outputs the second drive signal to the second drive circuit. A wiring path that transmits the first power supply voltage from the first isolated power supply circuit to the first drive circuit is preferably less than or equal to 5 cm.

This makes it difficult for the wiring of a power supply path from the isolated power supply circuit to the drive circuit to receive high-frequency switching noise. Therefore, noise superimposed on the drive signal to the switching element is reduced, which contributes to downsizing of the class-D power converter, and at the same time, a stable operation without malfunction can be performed in the class-D power converter.

A class-D power converter according to another aspect of the present disclosure includes a switch circuit, a drive circuit, an isolated power supply circuit, and an isolation signal converter. The switch circuit includes a first semiconductor element and a second semiconductor element connected in series with each other. Further, the switch circuit receives a DC voltage of 100 V or more. The drive circuit causes the first semiconductor element or the second semiconductor element to perform a switching operation. A predetermined power supply voltage is input to the isolated power supply circuit. The isolated power supply circuit converts the predetermined power supply voltage into a first power supply voltage isolated from the predetermined power supply voltage. Further, the isolated power supply circuit outputs the first power supply voltage to the drive circuit. The isolation signal converter receives a first signal of 6 MHz or more. The isolation signal converter converts the first signal into a first drive signal isolated from the first signal. Further, the isolation signal converter outputs the first drive signal to the drive circuit. The drive circuit includes a first drive circuit and a second drive circuit. The first drive circuit causes the first semiconductor element to perform a switching operation. The second drive circuit causes the second semiconductor element to perform a switching operation. The isolated power supply circuit includes a first isolated power supply circuit and a second isolated power supply circuit. A predetermined power supply voltage is input to the first isolated power supply circuit. The first isolated power supply circuit converts the predetermined power supply voltage into the first power supply voltage. Further, the first isolated power supply circuit outputs the first power supply voltage to the first drive circuit. A predetermined power supply voltage is input to the second isolated power supply circuit. The second isolated power supply circuit converts the predetermined power supply voltage into a second power supply voltage. Further, the second isolated power supply circuit outputs the second power supply voltage to the second drive circuit. The isolation signal converter includes a first isolation signal converter and a second isolation signal converter. The first isolation signal converter receives the first signal. The first isolation signal converter converts the first signal into the first drive signal. Further, the first isolation signal converter outputs the first drive signal to the first drive circuit. The second isolation signal converter receives a second signal of 6 MHz or more. The second isolation signal converter converts the second signal into a second drive signal isolated from the second signal. Further, the second isolation signal converter outputs the second drive signal to the second drive circuit. A wiring path that transmits the first power supply voltage from the first isolated power supply circuit to the first drive circuit is less than or equal to 5 cm. The first semiconductor element and the second semiconductor element are wide bandgap semiconductor elements. The class-D power converter changes a potential at a connection point between the first semiconductor element and the second semiconductor element at a maximum speed of 50 V/ns or more, and outputs an AC voltage having a power of 1 kW or more from the connection point.

According to the class-D power converter having the above configuration, a wiring of a power supply path from the isolated power supply circuit to the drive circuit hardly receives high-frequency switching noise. Therefore, according to the class-D power converter having the above configuration, it is possible to reduce noise superimposed on the drive signal to the switching element, contribute to miniaturization, and at the same time, perform a stable operation without malfunction.

Preferably, the first isolated power supply circuit, the second isolated power supply circuit, the first isolation signal converter, and the second isolation signal converter are linearly arranged.

As a result, it is possible to reduce an area occupied on the substrate by the isolated power supply circuit and the isolation signal converter while securing an insulation distance of each circuit, and it is possible to downsize the class-D power converter.

Further, it is preferable that the isolated power supply circuit does not receive a feedback signal from an output side.

As a result, high-frequency switching noise superimposed on the feedback signal is suppressed, and a stable operation without malfunction can be performed in the class-D power converter.

Further, the isolated power supply circuit may include an output voltage variable circuit that sets a potential of the first power supply voltage.

As a result, when the power supply voltage input to the isolated power supply circuit is not a desired value or varies depending on various conditions, or when a driving condition of the switch circuit is changed, it is possible to adjust the drive voltage in the class-D power converter to achieve an optimum driving condition.

Furthermore, a noise elimination circuit may be provided in a path that transmits the first power supply voltage between the isolated power supply circuit and the drive circuit. Here, the noise elimination circuit may have a rectifier element and a resistive element connected in series with each other in the path, and the noise elimination circuit may have a bypass capacitor in the path.

As a result, the influence of the high-frequency switching noise can be eliminated, and a stable operation without malfunction can be performed in the class-D power converter.

Furthermore, a shield structure that shields at least a part of a wiring that transmits the first power supply voltage between the insulated power supply circuit and the drive circuit may be provided.

As a result, the influence of the high-frequency switching noise can be eliminated, and a stable operation without malfunction can be performed in the class-D power converter.

Hereinafter, a specific example of a class-D power converter according to an aspect of the present disclosure will be described with reference to the drawings. Note that each of exemplary embodiments to be described below provides a comprehensive or specific example. Numerical values, shapes, materials, components, arrangement positions and connection modes of the components, and the like illustrated in the following exemplary embodiments are merely examples, and are not intended to limit the present disclosure. Note that each figure is a schematic diagram and is not necessarily strictly illustrated.

First Exemplary Embodiment

FIG. 1 is a block diagram illustrating a circuit configuration example of class-D power converter 10 according to a first exemplary embodiment.

As illustrated in FIG. 1, class-D power converter 10 includes switch circuit 1, heat dissipation substrate 2, control board 3, first drive circuit 31, second drive circuit 32, first isolated power supply circuit 41, second isolated power supply circuit 42, first signal generator 51, second signal generator 52, first isolation signal converter 61, and second isolation signal converter 62.

Switch circuit 1 includes first semiconductor element 21 and second semiconductor element 22 connected in series with each other, and the switch circuit 1 receives a DC voltage (here, DC voltage Ei) of 100 V or more.

Each of first semiconductor element 21 and second semiconductor element 22 is a wide bandgap semiconductor element capable of performing a switching operation. Here, as an example, first semiconductor element 21 and second semiconductor element 22 will be described as GaN field effect transistors (GaN-FETs), but are not necessarily limited to the GaN-FETs as long as they are wide bandgap semiconductor elements capable of performing the switching operation.

In switch circuit 1, first semiconductor element 21 is disposed on a high side, and second semiconductor element 22 is disposed on a low side.

A predetermined power supply voltage (here, DC input voltage Vcc) is input to first isolated power supply circuit 41. First isolated power supply circuit 41 converts the input power supply voltage into first power supply voltage VD1 isolated from the power supply voltage. Then, first isolated power supply circuit 41 outputs first power supply voltage VD1 to first drive circuit 31.

A predetermined power supply voltage (here, DC input voltage Vcc) is input to second isolated power supply circuit 42. Second isolated power supply circuit 42 converts the input power supply voltage into second power supply voltage VD2 isolated from the power supply voltage. Then, second isolated power supply circuit 42 outputs second power supply voltage VD2 to second drive circuit 32.

First signal generator 51 receives first input signal 51. Then, first signal generator 51 outputs first drive signal DR11 of 6 MHz or more for determining an on state and an off state of first semiconductor element 21 to first isolation signal converter 61. First drive signal DR11 is hereinafter also referred to as first signal DR11.

Second signal generator 52 receives second input signal S2. Then, second signal generator 52 outputs second drive signal DR21 of 6 MHz or more for determining an on state and an off state of second semiconductor element 22 to second isolation signal converter 62. Second drive signal DR21 is hereinafter also referred to as second signal DR21.

First isolation signal converter 61 receives first drive signal DR11 of 6 MHz or more output from first signal generator 51. First isolation signal converter 61 converts input first drive signal DR11 into first drive signal DR12 of 6 MHz or more isolated from first drive signal DR11. Then, first isolation signal converter 61 outputs first drive signal DR12 to first drive circuit 31. First isolation signal converter 61 may be achieved by, for example, a photocoupler or a transformer.

Second isolation signal converter 62 receives second drive signal DR21 of 6 MHz or more output from second signal generator 52. Second isolation signal converter 62 converts input second drive signal DR21 into second drive signal DR22 of 6 MHz or more isolated from second drive signal DR21. Then, second isolation signal converter 62 outputs second drive signal DR22 to second drive circuit 32. Second isolation signal converter 62 may be achieved by, for example, a photocoupler or a transformer.

First drive circuit 31 causes first semiconductor element 21 to perform a switching operation. More specifically, first drive circuit 31 operates using first power supply voltage VD1 output from first isolated power supply circuit 41 as a power source. Then, first drive circuit 31 drives a gate of first semiconductor element 21 according to first drive signal DR12 output from first isolation signal converter 61. In this way, first drive circuit 31 causes high-side first semiconductor element 21 to perform a switching operation.

Second drive circuit 32 causes second semiconductor element 22 to perform a switching operation. More specifically, second drive circuit 32 operates using second power supply voltage VD2 output from second isolated power supply circuit 42 as a power source. Then, second drive circuit 32 drives a gate of second semiconductor element 22 according to second drive signal DR22 output from second isolation signal converter 62. In this way, second drive circuit 32 causes second semiconductor element 22 to perform a switching operation.

Heat dissipation substrate 2 is a circuit board having excellent heat dissipation on which switch circuit 1, first drive circuit 31, and second drive circuit 32 are mounted.

Control board 3 is a single circuit board on which first isolated power supply circuit 41, second isolated power supply circuit 42, first signal generator 51, second signal generator 52, first isolation signal converter 61, and second isolation signal converter 62 are mounted. Since control board 3 is a single circuit board, control board 3 is hereinafter also referred to as single substrate 3.

In class-D power converter 10 having the above configuration, DC voltage Ei is applied to switch circuit 1, and first semiconductor element 21 and second semiconductor element 22 connected in series with each other perform a switching operation complementarily. By this switching operation, pulse voltage Vo, which is an AC voltage, is output from a connection point between first semiconductor element 21 and second semiconductor element 22. The power of this AC voltage is 1 kW or more, and the switching frequency is 6 MHz or more. The complementary switching operation is provided with a minute time called a dead time in which first semiconductor element 21 and second semiconductor element 22 are simultaneously turned off so that first semiconductor element 21 and second semiconductor element 22 are not simultaneously turned on. Class-D power converter 10 changes a potential at the connection point between first semiconductor element 21 and second semiconductor element 22 at a maximum speed of 50 V/ns or more by the complementary switching operation.

Assuming that a ratio of the time during which first semiconductor element 21 on the high side is in an on state to the switching cycle is time ratio δ, average value Vo of the pulse voltage output from class-D power converter 10 is Vo=δ×Ei. For example, by DC-averaging and outputting the output pulse voltage via an LC filter, and stabilizing the DC output voltage by controlling time ratio δ, class-D power converter 10 can be used as a step-down switching power supply. Further, if time ratio δ is modulated with an AC component such as an audio signal, class-D power converter 10 can be used for a class-D amplifier that amplifies and outputs the audio signal. Furthermore, if an AC output is obtained by removing a DC component by using a voltage difference between outputs of a plurality of class-D power converters 10, class-D power converter 10 can be used for an inverter. Controlling time ratio δ in the switching operation as described above is referred to as pulse width modulation (PWM) control.

First drive signal DR11 output from first signal generator 51 is PWM-controlled at time ratio δ, and second drive signal DR21 output from second signal generator 52 is PWM-controlled at a time ratio (1−δ). Here, first drive signal DR11 and second drive signal DR21 are pulse signals that repeat "H" and "L" complementarily with a dead time. Here, as illustrated in FIG. 1, first drive signal DR11 and second drive signal DR21 are transmitted by two signal lines that are displaced in positive and negative directions.

According to studies by the inventors, even if a metal-oxide semiconductor field-effect transistor (MOSFET) capable of operating at a higher speed than an insulated gate bipolar transistor (IGBT) is used as a switching element, the switching speed is limited to 40 V/ns in a conventional silicon semiconductor element, and a wide bandgap semiconductor element such as GaN is required to achieve a higher frequency. However, although the high-speed switching of the maximum speed of 50 V/ns or more can be achieved by using the wide bandgap semiconductor element, the malfunction in which the pulse width of the drive signal abnormally fluctuates is likely to occur due to the influence of high-frequency switching noise.

The inventors have further studied and found that it is effective to dispose first isolated power supply circuit 41 and first isolation signal converter 61, which are at least a drive system on the high side, close to each other on the same substrate in order to take measures against noise and prevent malfunction to reduce the influence of the high-frequency switching noise. As a result, downsizing of class-D power converter 10 by high-density mounting is achieved, and a power supply line of first isolated power supply circuit 41 exhibits a shielding effect on a wiring that transmits first drive signal DR12 as a small signal, so that the wiring that transmits the first drive signal DR12 hardly receives the high-frequency switching noise of switch circuit 1. Therefore, the noise superimposed on the drive signal to first semiconductor element 21 performing the switching operation is reduced, and class-D power converter 10 can perform the stable switching operation without malfunction.

Hereinafter, first isolated power supply circuit 41 and second isolated power supply circuit 42 will be described with reference to the drawings.

Figure 2A:
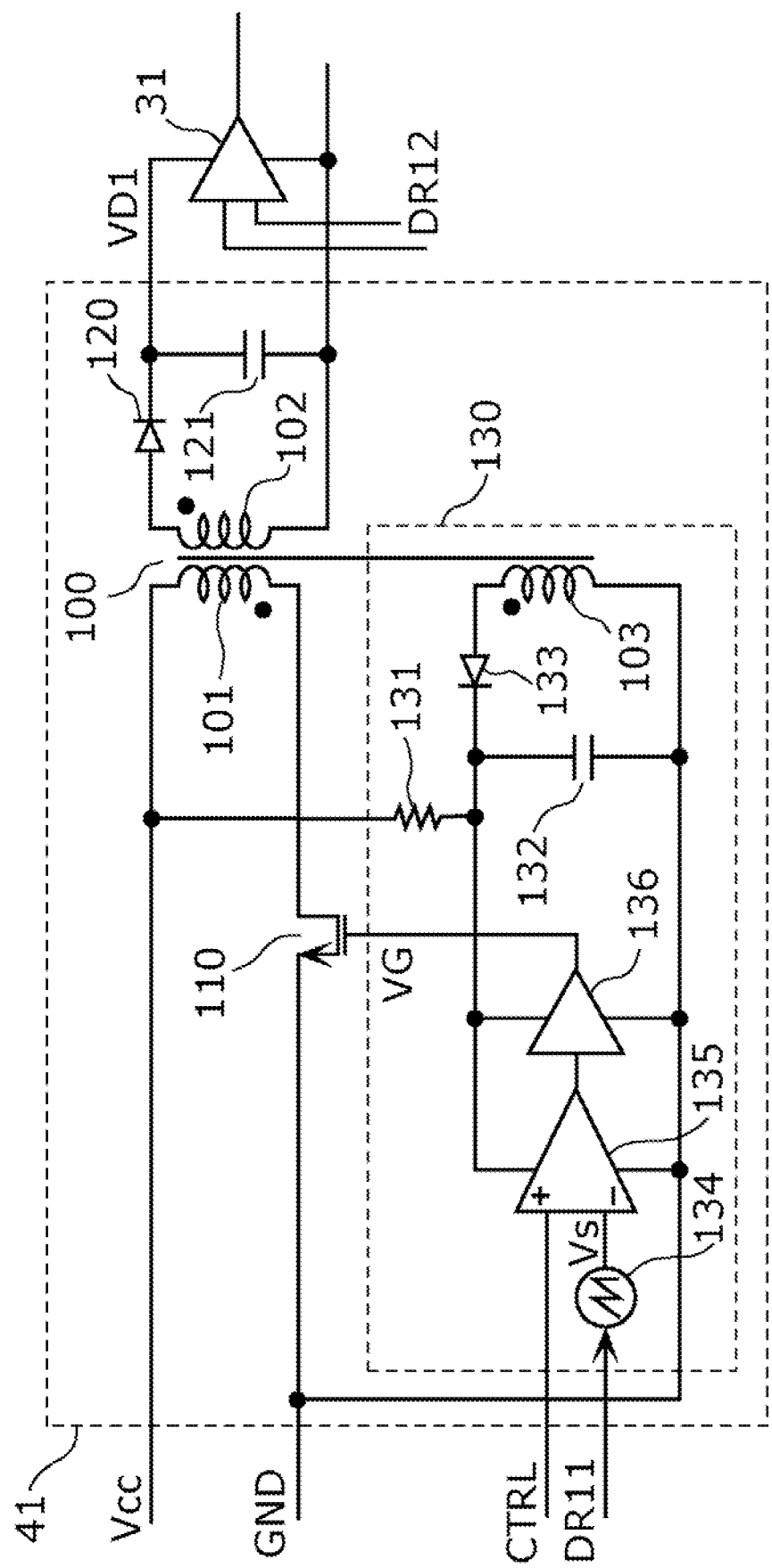
FIG. 2A is a block diagram illustrating a circuit configuration example of a first isolated power supply circuit according to the first exemplary embodiment.

FIG. 2A is a block diagram illustrating a circuit configuration example of first isolated power supply circuit 41.

First isolated power supply circuit 41 and second isolated power supply circuit 42 are similar to each other. For this reason, first isolated power supply circuit 41 will be described to explain both first isolated power supply circuit 41 and second isolated power supply circuit 42.

First isolated power supply circuit 41 is a flyback converter. As illustrated in FIG. 2A, first isolated power supply circuit 41 includes primary winding 101 and secondary winding 102 of transformer 100, switching element 110, diode 120, capacitor 121, and control drive circuit 130.

DC input voltage Vcc is applied to primary winding 101.

Switching element 110 is a MOSFET connected in series with primary winding 101. Drive pulse VG (described later) output from control drive circuit 130 is applied to a gate terminal of switching element 110, and the switching element switches between an ON state and an OFF state according to drive pulse VG.

When switching element 110 changes from the off state to the on state, a current flows from primary winding 101 to switching element 110, and a magnetic energy is stored in transformer 100.

When switching element 110 changes from the on state to the off state, the magnetic energy stored in transformer 100 is released, and a flyback voltage is generated in secondary winding 102. The flyback voltage generated in secondary winding 102 is rectified and smoothed by diode 120 and capacitor 121, and is output as first power supply voltage VD1 of first drive circuit 31 (in second isolated power supply circuit 42, as second power supply voltage VD2 of second drive circuit 32). That is, during the rectification and smoothing, a current flows from secondary winding 102 via diode 120 to capacitor 121, and the magnetic energy stored in transformer 100 is released. During a steady operation, the magnetic energy storage and release of transformer 100 are balanced. At this point, a ratio between number of turns N1 of primary winding 101 and number of turns N2 of secondary winding 102 is set to n (n=N2/N1). Further, a ratio of the time during which switching element 110 is turned on to the switching cycle is defined as time ratio δ1. Then, first power supply voltage VD1 output from first isolated power supply circuit 41 is approximately $$VD1 = n \times Vcc \times \delta 1 / (1 - \delta 1).$$

As can be seen from this equation, first power supply voltage VD1 can be adjusted by time ratio δ1 of switching element 110.

Note that, in FIG. 2A, an input signal to first drive circuit 31 is first drive signal DR12 that is an output signal of first isolation signal converter 61.

As illustrated in FIG. 2A, control drive circuit 130 includes bias winding 103 of transformer 100, activation resistor 131, capacitor 132, diode 133, sawtooth circuit 134, PWM comparator 135, and amplifier 136. Control drive circuit 130 receives control voltage CTRL and first drive signal DR11.

Capacitor 132 is charged via activation resistor 131 at start-up of first isolated power supply circuit 41. After the activation of first isolated power supply circuit 41, switching element 110 starts an operation for switching between an on state and an off state. At this time, a flyback voltage generated in bias winding 103 is rectified by diode 133 and charged in capacitor 132. The charged voltage of capacitor 132 is used as a bias voltage of an internal circuit of control drive circuit 130.

Sawtooth circuit 134 receives first drive signal DR11 and outputs sawtooth voltage Vs that increases and decreases in synchronization with a cycle of first drive signal DR11.

PWM comparator 135 compares control voltage CTRL with sawtooth voltage Vs, and outputs a comparison result signal that becomes a high level during a period of control voltage CTRL>sawtooth voltage Vs.

Amplifier 136 amplifies the comparison result signal to generate drive pulse VG, and outputs generated drive pulse VG to a gate of switching element 110.

In control drive circuit 130 having the above configuration, the higher control voltage CTRL, the longer a period during which drive pulse VG is at a high level. Therefore, time ratio δ1 of switching element 110 increases. As described above, according to first isolated power supply circuit 41, first power supply voltage VD1 to be output can be adjusted and set to a desired value by control voltage CTRL. That is, first isolated power supply circuit 41 includes an output voltage variable unit that sets a potential of first power supply voltage VD1.

Note that a switching frequency of first isolated power supply circuit 41 is synchronized with first input signal S1 to prevent malfunction due to interference. As another method for malfunction due to interference, a method of dividing first input signal S1 to set the switching cycle of first isolated power supply circuit 41 to an integral multiple of the switching cycle of class-D power converter 10 can be considered.

As described above, first isolated power supply circuit 41 performs AC conversion on an input DC input voltage by high-frequency switching, isolates the AC voltage subjected to the AC conversion by the transformer and transmits the isolated AC voltage to the secondary side, and rectifies and smooths the AC voltage generated on the secondary side of the transformer and outputs the rectified and smoothed AC voltage. A feedback signal from an output side is not input to first isolated power supply circuit 41. Therefore, high-frequency switching noise superimposed on the feedback signal is not input to first isolated power supply circuit 41. As a result, class-D power converter 10 can operate stably without malfunction. Even if the feedback signal from the output side is not input to first isolated power supply circuit 41, there is almost no load fluctuation of first isolated power supply circuit 41, so that no problem occurs.

As described above, first isolated power supply circuit 41 includes an output voltage conversion circuit that sets a potential of first power supply voltage VD1. As a result, when a desired value cannot be obtained for DC input voltage Vcc input to first isolated power supply circuit 41, when a driving condition of switch circuit 1 is changed, or the like, class-D power converter 10 can adjust first power supply voltage VD1 so that first power supply voltage VD1 becomes an optimum driving condition of switch circuit 1.

Note that, in class-D power converter 10, first isolated power supply circuit 41 and second isolated power supply circuit 42 may be integrated.

Figure 2B:
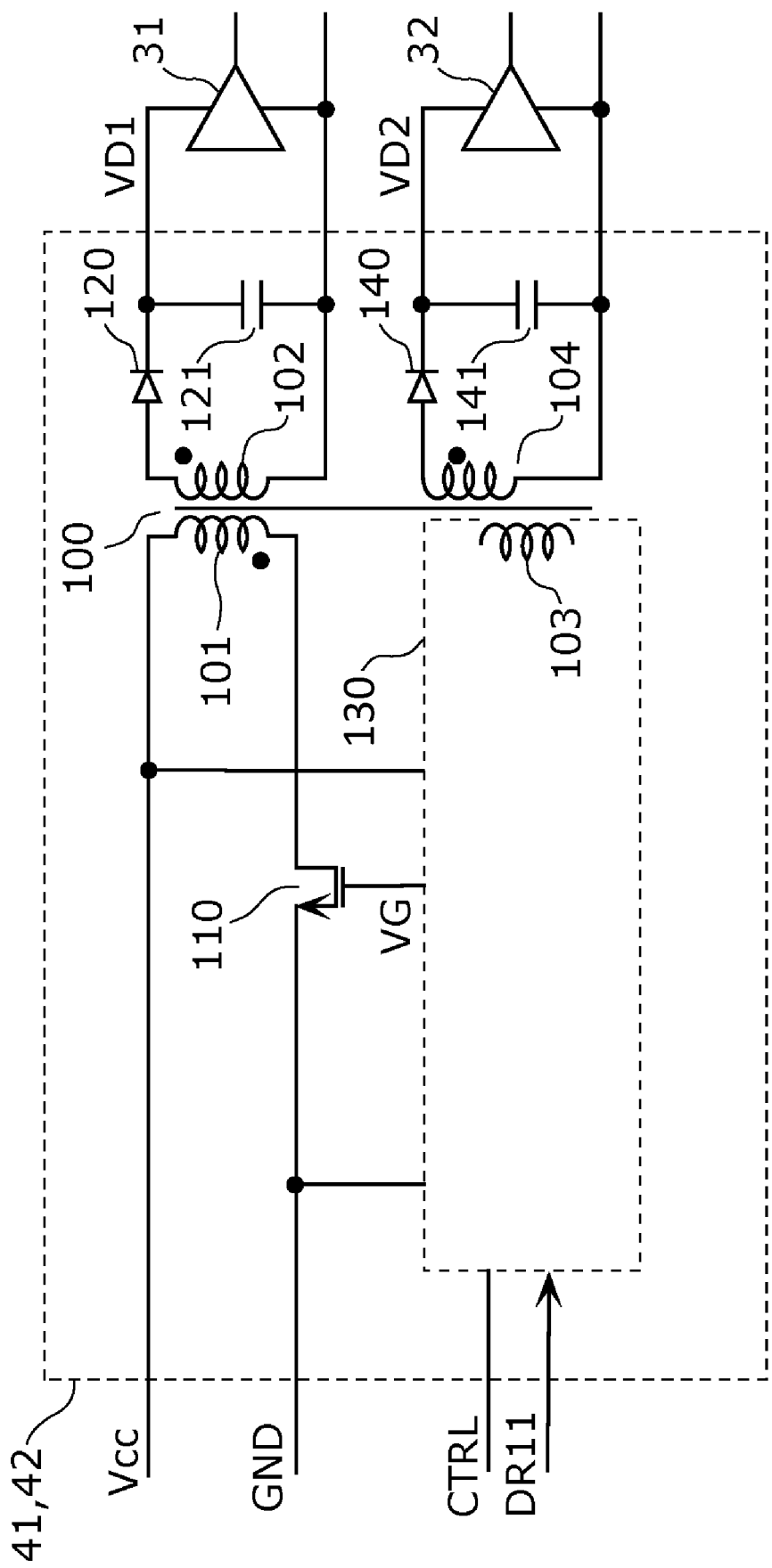
FIG. 2B is a block diagram illustrating a circuit configuration example of a first isolated power supply circuit and a second isolated power supply circuit according to the first exemplary embodiment, which are integrally configured.

FIG. 2B is a block diagram illustrating a circuit configuration example of first isolated power supply circuit 41 and second isolated power supply circuit 42 in a case where first isolated power supply circuit 41 and second isolated power supply circuit 42 are integrated. In the following description, a circuit constituted by first isolated power supply circuit 41 and second isolated power supply circuit 42 integrated with each other is also referred to as an "integrated isolated power supply circuit" for convenience.

The integrated isolated power supply circuit is configured by adding secondary winding 104 having the same number of windings as secondary winding 102, diode 140, and capacitor 141 to first isolated power supply circuit 41 illustrated in FIG. 2A. That is, the integrated isolated power supply circuit is configured by sharing primary winding 101, switching element 110, and control drive circuit 130 in first isolated power supply circuit 41 illustrated in FIG. 2A and second isolated power supply circuit 42.

With the above configuration, in the integrated isolated power supply circuit, a flyback voltage generated in secondary winding 102 is rectified and smoothed by diode 120 and capacitor 121 to be output as first power supply voltage VD1 of first drive circuit 31, and a flyback voltage generated in secondary winding 104 is rectified and smoothed by diode 140 and capacitor 141 to be output as second power supply voltage VD2 of second drive circuit 32.

As described above, according to class-D power converter 10 of the first exemplary embodiment, at least first isolated power supply circuit 41 and first isolation signal converter 61, which is a drive system on the high side, can be disposed close to each other on the same substrate. Therefore, downsizing of class-D power converter 10 by high-density mounting is achieved, and a power supply line of first isolated power supply circuit 41 exhibits a shielding effect on a wiring that transmits first drive signal DR12 that is a small signal. This makes it difficult for the wiring that transmits first drive signal DR12 to receive the high-frequency switching noise of switch circuit 1. As a result, noise superimposed on the drive signal to first semiconductor element 21 that performs a switching operation is reduced. As a result, class-D power converter 10 can perform a stable switching operation without malfunction.

Further, according to class-D power converter 10 according to the first exemplary embodiment, the feedback signal from the output side is not input to first isolated power supply circuit 41. Therefore, the high-frequency switching noise superimposed on the feedback signal is not input. As a result, class-D power converter 10 can operate stably without malfunction.

Furthermore, according to class-D power converter 10 according to the first exemplary embodiment, first isolated power supply circuit 41 includes the output voltage variable circuit that sets the potential of first power supply voltage VD1. As a result, class-D power converter 10 can adjust first power supply voltage VD1 so that first power supply voltage VD1 becomes an optimum driving condition of switch circuit 1.

Second Exemplary Embodiment

A class-D power converter according to a second exemplary embodiment will be described below. Here, in the class-D power converter according to the second exemplary embodiment, components similar to the components of class-D power converter 10 according to the first exemplary embodiment are denoted by the same reference marks as those already described, and a detailed description thereof will be omitted.

Figure 3:
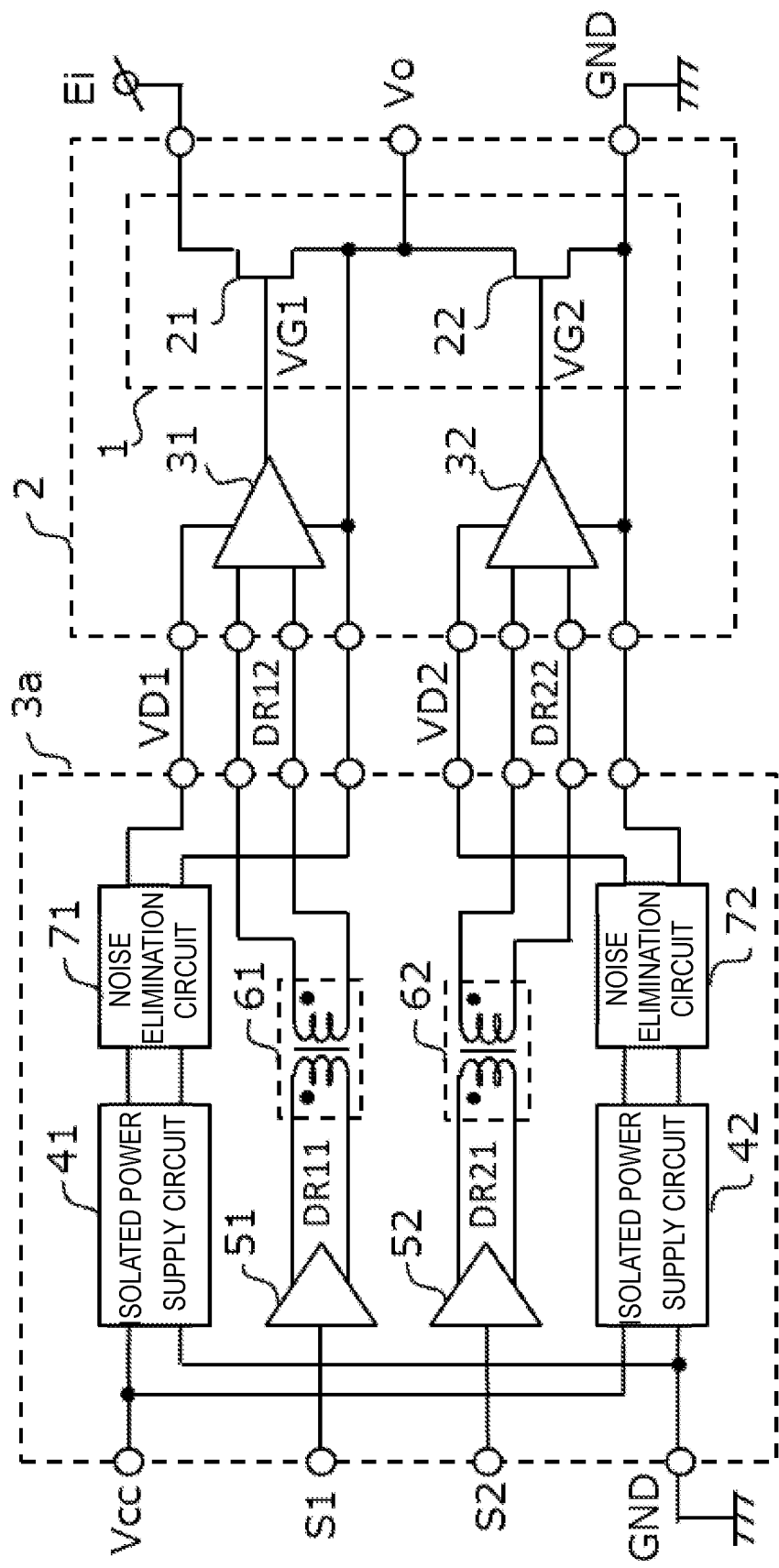
FIG. 3 is a block diagram illustrating a circuit configuration example of a class-D power converter according to a second exemplary embodiment.

FIG. 3 is a block diagram illustrating a circuit configuration example of class-D power converter 10A according to the second exemplary embodiment.

As illustrated in FIG. 3, class-D power converter 10A according to the second exemplary embodiment is configured such that, to class-D power converter 10 according to the first exemplary embodiment, first noise elimination circuit 71 is added to a path for transmitting first power supply voltage VD1 between first isolated power supply circuit 41 and first drive circuit 31, second noise elimination circuit 72 is added to a path for transmitting second power supply voltage VD2 between second isolated power supply circuit 42 and second drive circuit 32 are added, and control board 3 is changed to control board 3a.

Control board 3a is a single circuit board on which first noise elimination circuit 71 and second noise elimination circuit 72 are mounted in addition to first isolated power supply circuit 41, second isolated power supply circuit 42, first signal generator 51, second signal generator 52, first isolation signal converter 61, and second isolation signal converter 62.

According to the study of the inventors, in class-D power converter 10A, reduction of high-frequency switching noise superimposed on a power supply path from first isolated power supply circuit 41 or second isolated power supply circuit 42 to first drive circuit 31 or second drive circuit 32, particularly reduction of the high-frequency switching noise superimposed on the power supply path from first isolated power supply circuit 41 to first drive circuit 31 is effective for the stable switching operation in class-D power converter 10A.

Hereinafter, first noise elimination circuit 71 and second noise elimination circuit 72 will be described with reference to the drawings.

Figure 4:
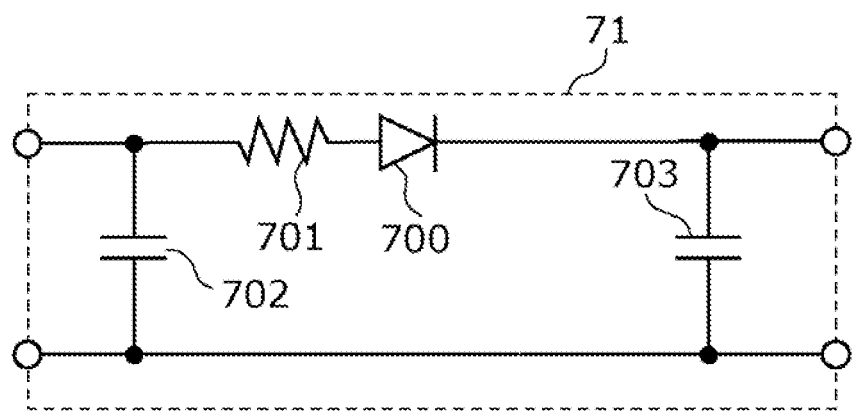
FIG. 4 is a block diagram illustrating a circuit configuration example of a first noise elimination circuit according to the second exemplary embodiment.

FIG. 4 is a block diagram illustrating a circuit configuration example of first noise elimination circuit 71.

First noise elimination circuit 71 and second noise elimination circuit 72 are similar circuits to each other. Therefore, here, both first noise elimination circuit 71 and second noise elimination circuit 72 will be described by explaining first noise elimination circuit 71.

As illustrated in FIG. 4, first noise elimination circuit 71 includes diode 700, resistor 701, bypass capacitor 702, and bypass capacitor 703.

As illustrated in FIG. 4, in first noise elimination circuit 71, diode 700 which is a rectifier element and resistor 701 which is a resistive element are connected in series in a path through which first power supply voltage VD1 is transmitted. Therefore, diode 700 blocks a reverse flow component of the high-frequency switching noise superimposed on the path for transmitting first power supply voltage VD1, and resistor 701 suppresses the amplitude thereof.

As illustrated in FIG. 4, in first noise elimination circuit 71, bypass capacitor 702 is disposed on an output end side of first isolated power supply circuit 41 in the path transmitting first power supply voltage VD1, and bypass capacitor 703 is disposed on an input end side of first drive circuit 31 in the path transmitting the first power supply voltage VD1. Therefore, bypass capacitor 702 and bypass capacitor 703 absorb the high-frequency switching noise superimposed on the path for transmitting first power supply voltage VD1.

The series connection between diode 700 and resistor 701, and the disposition of bypass capacitor 702 and bypass capacitor 703 described above are countermeasures against the high-frequency switching noise in a normal mode superimposed on the path for transmitting first power supply voltage VD1.

As described above, according to class-D power converter 10A according to the second exemplary embodiment, the high-frequency switching noise in the normal mode superimposed on the path for transmitting first power supply voltage VD1 is suppressed by first noise elimination circuit 71. Further, second noise elimination circuit 72 suppresses the high-frequency switching noise in the normal mode superimposed on the path for transmitting second power supply voltage VD2. As a result, class-D power converter 10A can perform a stable switching operation without malfunction.

Third Exemplary Embodiment

A class-D power converter according to a third exemplary embodiment will be described below. Here, regarding the class-D power converter according to the third exemplary embodiment, components similar to the components of class-D power converter 10A according to the second exemplary embodiment are denoted by the same reference marks as those already described, and a detailed description thereof will be omitted.

Figure 5:
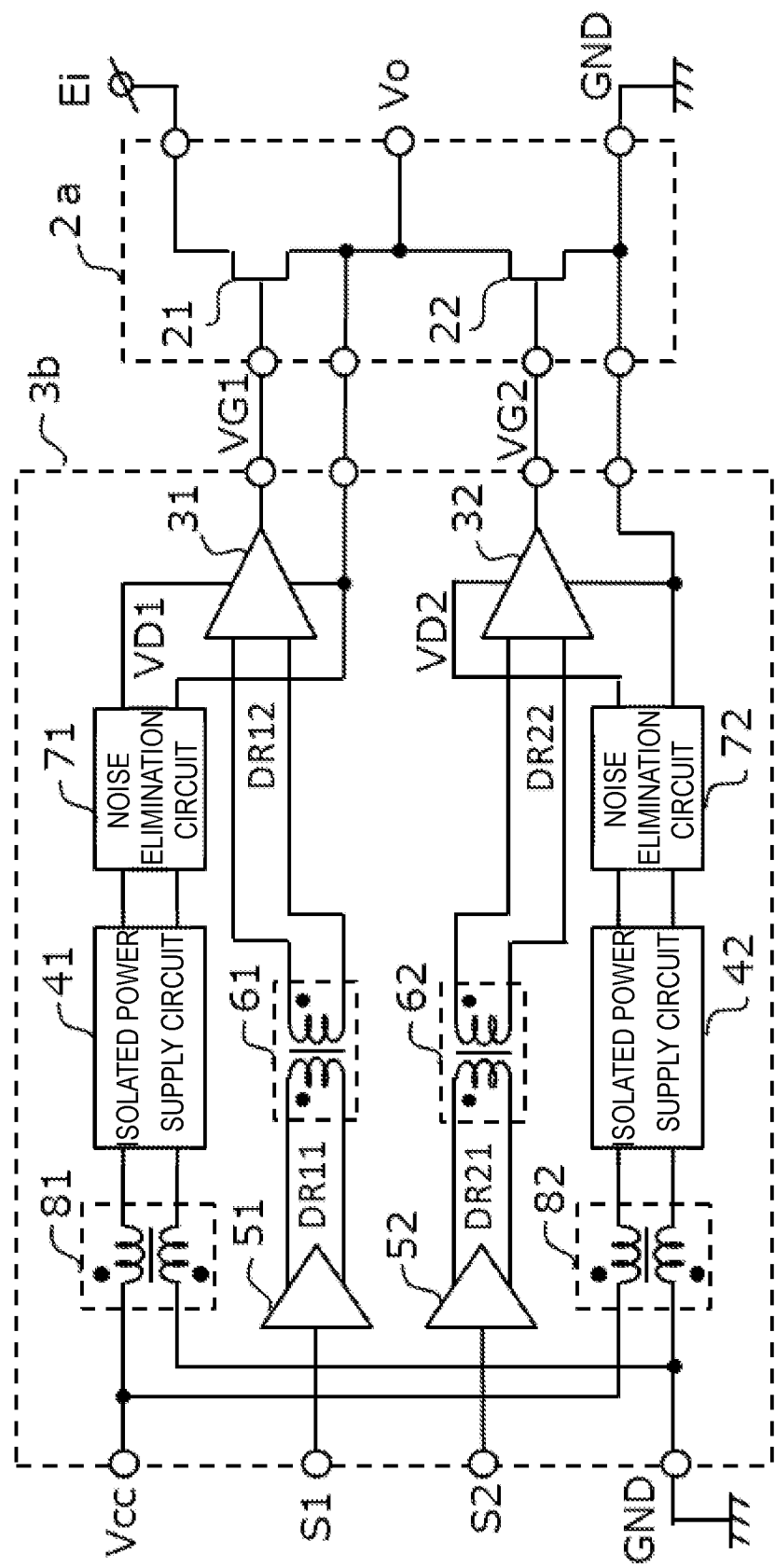
FIG. 5 is a block diagram illustrating a circuit configuration example of a class-D power converter according to a third exemplary embodiment.

FIG. 5 is a block diagram illustrating a circuit configuration example of class-D power converter 10B according to the third exemplary embodiment.

As illustrated in FIG. 5, class-D power converter 10B according to the third exemplary embodiment is configured such that common mode choke 81 is added to an input side of first isolated power supply circuit 41, common mode choke 82 is added to an input side of second isolated power supply circuit 42, control board 3a is changed to control board 3b, and heat dissipation substrate 2 is changed to heat dissipation substrate 2a, as compared with class-D power converter 10A according to the second exemplary embodiment.

Control board 3b is a single circuit board on which common mode choke 81, common mode choke 82, first drive circuit 31, and second drive circuit 32 are mounted, in addition to first isolated power supply circuit 41, second isolated power supply circuit 42, first signal generator 51, second signal generator 52, first isolation signal converter 61, second isolation signal converter 62, first noise elimination circuit 71, and second noise elimination circuit 72.

Heat dissipation substrate 2a is a circuit board having excellent heat dissipation on which switch circuit 1 is mounted.

According to the study of the inventors, it has been found that radiation noise due to the high-frequency switching radiated from class-D power converter 10B can be reduced by the following (a) and (b).

(a) To reduce a volume of and an occupied area on the circuit board of a constituent element group (hereinafter, this is also referred to as a "first constituent element group") including first drive circuit 31, first noise elimination circuit 71, first isolated power supply circuit 41, and first isolation signal converter 61.

(b) To reduce a volume and an occupied area on the circuit board of a constituent element group (hereinafter, this is also referred to as a "second constituent element group") including second drive circuit 32, second noise elimination circuit 72, second isolated power supply circuit 42, and second isolation signal converter 62.

As illustrated in FIG. 5, in class-D power converter 10B, the first constituent element group and the second constituent element group are mounted on control board 3b which is the same circuit board. Therefore, in class-D power converter 10B, the volume and the area occupied on the circuit board of the first constituent element group can be reduced, and the volume and the area occupied on the circuit board of the second constituent element group can be reduced. As a result, the radiation noise due to the high-frequency switching radiated from class-D power converter 10B is reduced. First semiconductor element 21 fluctuates in potential with high frequency and large amplitude with respect to a ground potential of class-D power converter 10B. Further, the drive system on the high side drives first semiconductor element 21. Therefore, reducing the volume and the occupied area on the circuit board of the first constituent element group constituting the drive system on the high side is particularly effective for reducing the radiation noise due to the high-frequency switching radiated from class-D power converter 10B.

As illustrated in FIG. 5, in class-D power converter 10B, common mode choke 81 is disposed on a path for transmitting DC input voltage Vcc to first isolated power supply circuit 41. Further, common mode choke 82 is disposed on a path for transmitting DC input voltage Vcc to second isolated power supply circuit 42. Therefore, common mode choke 81 and common mode choke 82 suppress the common mode high-frequency switching noise superimposed on the path for transmitting DC input voltage Vcc.

As described above, according to class-D power converter 10B according to the third exemplary embodiment, the radiation noise due to the high-frequency switching radiated from class-D power converter 10B is reduced. As a result, an adverse effect on class-D power converter 10B itself and an external peripheral circuit due to the radiation noise due to the high-frequency switching radiated from class-D power converter 10B is reduced.

Furthermore, according to class-D power converter 10B according to the third exemplary embodiment, the common mode high-frequency switching noise superimposed on the path for transmitting DC input voltage Vcc is suppressed by common mode choke 81 and common mode choke 82. As a result, class-D power converter 10B can perform a stable switching operation without malfunction.

Fourth Exemplary Embodiment

A class-D power converter according to a fourth exemplary embodiment will be described below.

The circuit configuration of the class-D power converter according to the fourth exemplary embodiment is similar to that of class-D power converter 10 according to the first exemplary embodiment. On the other hand, the class-D power converter according to the fourth exemplary embodiment is characterized by its physical structure. Therefore, the class-D power conversion according to the fourth exemplary embodiment will be described mainly with respect to its physical structure. Further, here, components of the class-D power conversion according to the fourth exemplary embodiment will be described in addition to the contents described in the first exemplary embodiment.

Figure 6:
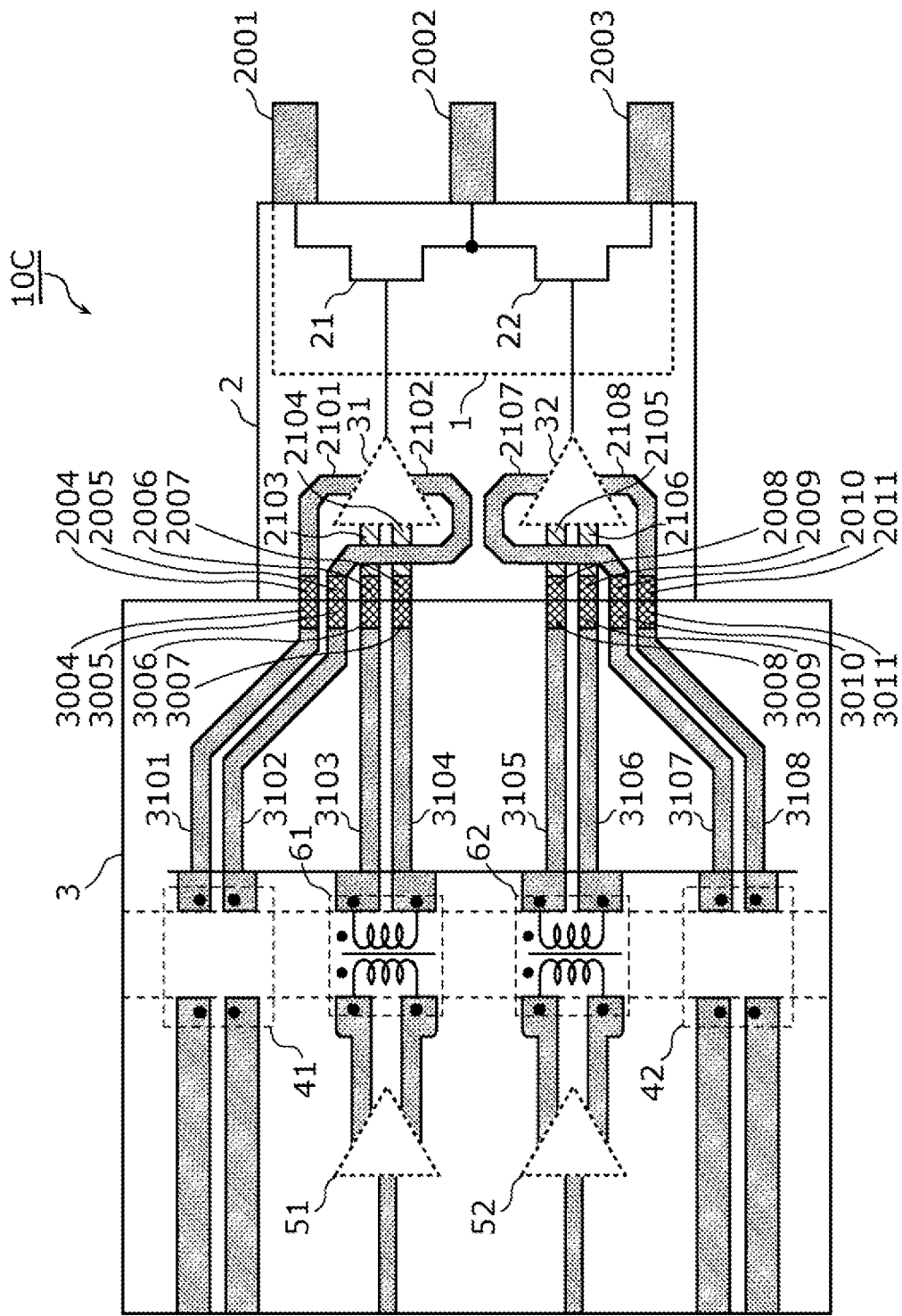
FIG. 6 is a schematic diagram illustrating of a physical configuration example of a class-D power converter according to a fourth exemplary embodiment.

FIG. 6 is a schematic diagram illustrating a physical structure example of class-D power converter 10C according to the fourth exemplary embodiment. In the following description, an expression "left and right" means left and right in a plan view of FIG. 6.

As illustrated in FIG. 6, first semiconductor element 21, second semiconductor element 22, first drive circuit 31, and second drive circuit 32 are disposed on a surface of heat dissipation substrate 2.

Input terminal 2001, output terminal 2002, and GND terminal 2003 are disposed on a right side of the surface of heat dissipation substrate 2. Input terminal 2001 is connected to a drain of first semiconductor element 21. Output terminal 2002 is connected to a connection point between a source of first semiconductor element 21 and a drain of second semiconductor element 22. GND terminal 2003 is connected to a source of second semiconductor element 22. First power supply terminal 2004, first common terminal 2005, first drive signal terminal 2006, first drive signal terminal 2007, second drive signal terminal 2008, second drive signal terminal 2009, second power supply terminal 2010, and second common terminal 2011 are disposed on a left side of the surface of heat dissipation substrate 2. First power supply terminal 2004 is a terminal for supplying first power supply voltage VD1 to first drive circuit 31. First common terminal 2005 is a terminal for supplying a common voltage to first drive circuit 31. First drive signal terminal 2006 and first drive signal terminal 2007 are terminals for supplying first drive signal DR12 to first drive circuit 31. Second power supply terminal 2010 is a terminal for supplying second power supply voltage VD2 to second drive circuit 32. Second common terminal 2011 is a terminal for supplying a common voltage to second drive circuit 32. Second drive signal terminal 2008 and second drive signal terminal 2009 are terminals for supplying second drive signal DR22 to second drive circuit 32.

Wiring pattern 2101, wiring pattern 2102, wiring pattern 2107, and wiring pattern 2108 are disposed on the surface of heat dissipation substrate 2. Wiring pattern 2101 connects first power supply terminal 2004 and first drive circuit 31. Wiring pattern 2102 connects first common terminal 2005 and first drive circuit 31. Wiring pattern 2107 connects second power supply terminal 2010 and second drive circuit 32. Wiring pattern 2108 connects second common terminal 2011 and second drive circuit 32. On a back surface of heat dissipation substrate 2, wiring pattern 2103, wiring pattern 2104, wiring pattern 2105, and wiring pattern 2106 are disposed. Wiring pattern 2103 connects first drive signal terminal 2006 and first drive circuit 31. Wiring pattern 2104 connects first drive signal terminal 2007 and first drive circuit 31. Wiring pattern 2105 connects second drive signal terminal 2008 and second drive circuit 32. Wiring pattern 2106 connects second drive signal terminal 2009 and second drive circuit 32. As illustrated in FIG. 6, first signal generator 51, second signal generator 52, first isolated power supply circuit 41, first isolation signal converter 61, second isolation signal converter 62, and second isolated power supply circuit 42 are disposed on the surface of control board 3.

Here, first isolated power supply circuit 41, first isolation signal converter 61, second isolation signal converter 62, and second isolated power supply circuit 42 are linearly arranged as illustrated in FIG. 6. Since first isolated power supply circuit 41, first isolation signal converter 61, second isolation signal converter 62, and second isolated power supply circuit 42 are linearly arranged, an insulation distance between the circuits can be secured. At the same time, the area occupied on control board 3 by first isolated power supply circuit 41, first isolation signal converter 61, second isolation signal converter 62, and second isolated power supply circuit 42 can be reduced. That is, the area of control board 3 can be reduced.

First power supply terminal 3004, first common terminal 3005, first drive signal terminal 3006, first drive signal terminal 3007, second drive signal terminal 3008, second drive signal terminal 3009, second power supply terminal 3010, and second common terminal 3011 are arranged on a right side of a surface of control board 3. First power supply terminal 3004 is a terminal for supplying first power supply voltage VD1 to first drive circuit 31. First common terminal 3005 is a terminal for supplying a common voltage to first drive circuit 31. First drive signal terminal 3006 and first drive signal terminal 3007 are terminals for supplying first drive signal DR12 to first drive circuit 31. Second power supply terminal 3010 is a terminal for supplying second power supply voltage VD2 to second drive circuit 32. Second common terminal 3011 is a terminal for supplying a common voltage to second drive circuit 32. Second drive signal terminal 3008 and second drive signal terminal 3009 are terminals for supplying second drive signal DR22 to second drive circuit 32. Here, first power supply terminal 3004, first common terminal 3005, first drive signal terminal 3006, first drive signal terminal 3007, second power supply terminal 3010, second common terminal 3011, second drive signal terminal 3008, and second drive signal terminal 3009 are arranged at positions facing first power supply terminal 2004, first common terminal 2005, first drive signal terminal 2006, first drive signal terminal 2007, second power supply terminal 2010, second common terminal 2011, second drive signal terminal 2008, and second drive signal terminal 2009, respectively. Then, first power supply terminal 3004 and first power supply terminal 2004 are joined by solder. First common terminal 3005 and first common terminal 2005 are joined by solder. First drive signal terminal 3006 and first drive signal terminal 2006 are joined by solder. First drive signal terminal 3007 and first drive signal terminal 2007 are joined by solder. Second power supply terminal 3010 and second power supply terminal 2010 are joined by solder. Second common terminal 3011 and second common terminal 2011 are joined by solder. Second drive signal terminal 3008 and second drive signal terminal 2008 are joined by solder. Second drive signal terminal 3009 and second drive signal terminal 2009 are joined by solder.

In addition, wiring pattern 3101, wiring pattern 3102, wiring pattern 3103, wiring pattern 3104, wiring pattern 3105, wiring pattern 3106, wiring pattern 3107, and wiring pattern 3108 are arranged on the surface of control board 3. Wiring pattern 3101 connects first isolated power supply circuit 41 and first power supply terminal 3004. Wiring pattern 3102 connects first isolated power supply circuit 41 and first common terminal 3005. Wiring pattern 3103 connects first isolation signal converter 61 and first drive signal terminal 3006. Wiring pattern 3104 connects first isolation signal converter 61 and first drive signal terminal 3007. Wiring pattern 3107 connects second isolated power supply circuit 42 and second power supply terminal 3010. Wiring pattern 3108 connects second isolated power supply circuit 42 and second common terminal 3011. Wiring pattern 3105 connects second isolation signal converter 62 and second drive signal terminal 3008. Wiring pattern 3106 connects second isolation signal converter 62 and second drive signal terminal 3009.

In class-D power converter 10C, a wiring path (hereinafter, it is also referred to as a "first wiring path") for transmitting first power supply voltage VD1 from first isolated power supply circuit 41 to first drive circuit 31 is less than or equal to 5 cm. A wiring path (hereinafter, it is also referred to as a "second wiring path") for transmitting a common voltage from first isolated power supply circuit 41 to first drive circuit 31 is less than or equal to 5 cm. A wiring path (hereinafter, it is also referred to as a "third wiring path") for transmitting second power supply voltage VD2 from second isolated power supply circuit 42 to second drive circuit 32 is less than or equal to 5 cm. A wiring path (hereinafter, it is also referred to as a "fourth wiring path") for transmitting a common voltage from second isolated power supply circuit 42 to second drive circuit 32 is less than or equal to 5 cm.

Specifically, the first wiring path is a wiring path including wiring pattern 3101, first power supply terminal 3004, first power supply terminal 2004, and wiring pattern 2101. The second wiring path is a wiring path including wiring pattern 3102, first common terminal 3005, first common terminal 2005, and wiring pattern 2102. The third wiring path is a wiring path including wiring pattern 3107, second power supply terminal 3010, second power supply terminal 2010, and wiring pattern 2107. The fourth wiring path is a wiring path including wiring pattern 3108, second common terminal 3011, second common terminal 2011, and wiring pattern 2108.

As with class-D power converter 10 according to the first exemplary embodiment, class-D power converter 10C having the above configuration receives DC voltage Ei of 100 V or higher, and outputs pulse voltage Vo, which is an AC voltage having a power of 1 kW or higher, and has a switching frequency of 6 MHz or higher.

The reason why the first wiring path, the second wiring path, the third wiring path, and the fourth wiring path are each less than or equal to 5 cm in class-D power converter 10C will be described below.

Figure 7:
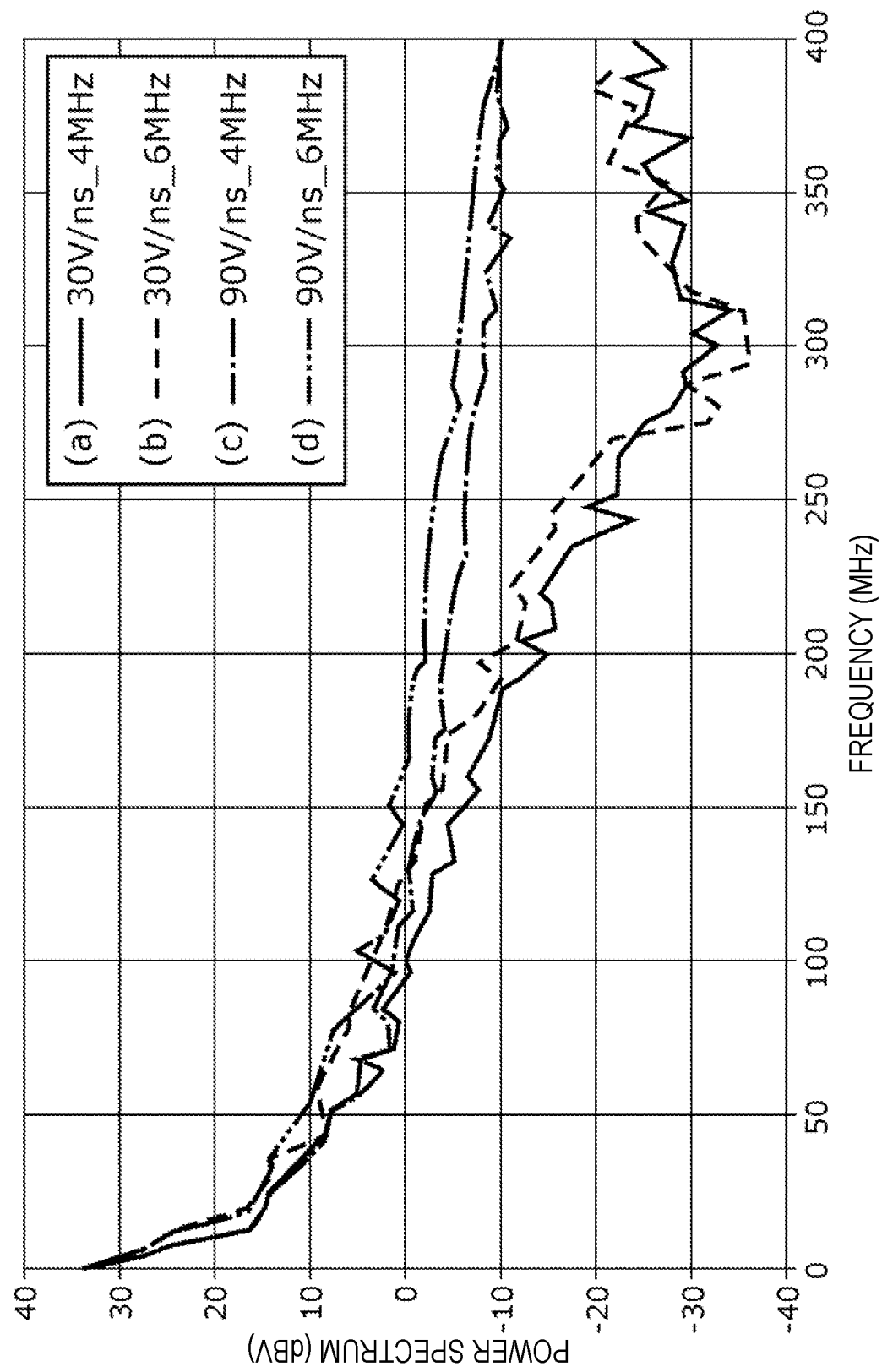
FIG. 7 is a diagram illustrating a result of Fourier analysis of a waveform when a semiconductor element is subjected to high-speed switching.

FIG. 7 is a diagram illustrating a Fourier analysis result of a switching waveform when a semiconductor element is subjected to high-speed switching so as to output a pulse having a peak value of 100 V and a time ratio of 0.25.

As illustrated in FIG. 7, a horizontal axis represents the frequency, and a vertical axis represents the power spectrum. Here, a state in which the power spectrum is 0 dBV corresponds to a state in which the amplitude is 1 V, that is, a level of 1/100 of the peak value.

In FIG. 7, a polygonal line (a) is a polygonal line illustrating a relationship between the frequency and the power spectrum when a switching frequency is 4 MHz and the maximum switching speed is 30 V/ns.

A polygonal line (b) is a polygonal line illustrating a relationship between the frequency and the power spectrum when a switching frequency is 6 MHz and the maximum switching speed is 30 V/ns.

A polygonal line (c) is a polygonal line illustrating a relationship between the frequency and the power spectrum when a switching frequency is 4 MHz and the maximum switching speed is 90 V/ns.

A polygonal line (d) is a polygonal line illustrating a relationship between the frequency and the power spectrum when a switching frequency is 6 MHz and the maximum switching speed is 90 V/ns.

According to the study by the inventors, in a case where the first wiring path, the second wiring path, the third wiring path, and the fourth wiring path have arbitrary lengths, when first semiconductor element 21 and second semiconductor element 22 are caused to perform high-speed switching so as to output a pulse having a peak value of 100 V and a time ratio of 0.25, it has been found that a malfunction of class-D power converter 10C due to the influence of high-frequency switching noise does not occur if the maximum switching speed is 50 V/ns or less (for example, 30 V/ns) or the switching frequency is 4 MHz.

On the other hand, in a case where the first wiring path, the second wiring path, the third wiring path, and the fourth wiring path have arbitrary lengths, when first semiconductor element 21 and second semiconductor element 22 are caused to perform high-speed switching so as to output a pulse having a peak value of 100 V and a time ratio of 0.25, it has been found that a malfunction of class-D power converter 10C due to the influence of high-frequency switching noise occurs when the maximum switching speed is 50 V/ns or more (for example, 90 V/ns) and the switching frequency is 6 MHz or more.

From FIG. 7, it can be seen that the polygonal line (a), the polygonal line (b), and the polygonal line (c) have a power spectrum at a level of $1/100$ or less of the peak value in the frequency region of 130 MHz to 175 MHz. Further, it can be seen that the polygonal line (d) has the power spectrum at a level of $1/100$ or more of the peak value in the frequency region of 130 MHz to 175 MHz. From these, the inventors considered that the cause of the malfunction of class-D power converter 10C due to the influence of the high-frequency switching noise, which occurs when the maximum switching speed is 50 V/ns or more and the switching frequency is 6 MHz or more, is noise in the frequency domain of 130 MHz to 175 MHz radiated from class-D power converter 10C. Then, the inventors made further investigations based on this idea, and arrived at the finding that by setting the lengths of the first wiring path, the second wiring path, the third wiring path, and the fourth wiring path to lengths that do not serve as reception antennas for electromagnetic waves in a frequency band of 175 MHz or less, it is possible to suppress malfunction of class-D power converter 10C due to the influence of the high-frequency switching noise generated when the maximum switching speed is 50 V/ns or more and the switching frequency is 6 MHz or more.

Assuming that the speed of light is $3\times10^8$ m/s and the relative dielectric constant of the substrate is 4.6, a wavelength $\lambda 1$ of the electromagnetic wave of 175 MHz on control board 3 can be expressed as follows.

$$\lambda 1 = \frac{3\times 10^8}{175\times 10^6 \times \sqrt{4.6}} \approx 0.8\ m = 80\ cm \quad \text{[Mathematical formula 1]}$$

An antenna length for receiving the wavelength $\lambda 1$ is $\lambda 1/4=20$ cm. A length that does not become an antenna that receives the wavelength $\lambda 1$ is $1/4$ or less of the antenna length, that is, 20 cm/4=5 cm.

For these reasons, the inventors set the lengths of the first wiring path, the second wiring path, the third wiring path, and the fourth wiring path to less than or equal to 5 cm in class-D power converter 10C. As a result, even when the maximum switching speed is 50 V/ns or more and the switching frequency is 6 MHz or more, class-D power converter 10C can perform a stable switching operation without malfunction.

As described above, according to class-D power converter 10C of the fourth exemplary embodiment, first isolated power supply circuit 41, first isolation signal converter 61, second isolation signal converter 62, and second isolated power supply circuit 42 are linearly arranged. As a result, class-D power converter 10C can reduce the area occupied by first isolated power supply circuit 41, first isolation signal converter 61, second isolation signal converter 62, and second isolated power supply circuit 42 on control board 3 while securing the insulation distance. That is, the area of control board 3 can be reduced.

Further, according to class-D power converter 10C of the fourth exemplary embodiment, the lengths of the first wiring path, the second wiring path, the third wiring path, and the fourth wiring path are less than or equal to 5 cm. Therefore, the first wiring path, the second wiring path, the third wiring path, and the fourth wiring path do not serve as reception antennas for electromagnetic waves in a frequency band of 175 MHz or less. As a result, since the malfunction of class-D power converter 10C due to the influence of the high-frequency switching noise generated when the maximum switching speed is 50 V/ns or more and the switching frequency is 6 MHz or more is suppressed, class-D power converter 10C can perform a stable switching operation without malfunction.

Fifth Exemplary Embodiment

A class-D power converter according to a fifth exemplary embodiment will be described below.

A circuit configuration of the class-D power converter according to the fifth exemplary embodiment is similar to that of class-D power converter 10 according to the first exemplary embodiment and class-D power converter 10C according to the fourth exemplary embodiment. On the other hand, the class-D power converter according to the fifth exemplary embodiment is configured such that in class-D power converter 10C according to the fourth exemplary embodiment, control board 3 is changed to control board 3d according to the fifth exemplary embodiment, and the physical structure of a part of the wiring pattern on control board 3 is changed. Therefore, the class-D power converter according to the fifth exemplary embodiment will now be described focusing on control board 3d according to the fifth exemplary embodiment and the partial physical structure of the wiring patterns on the control board according to the fifth exemplary embodiment.

Figure 8:
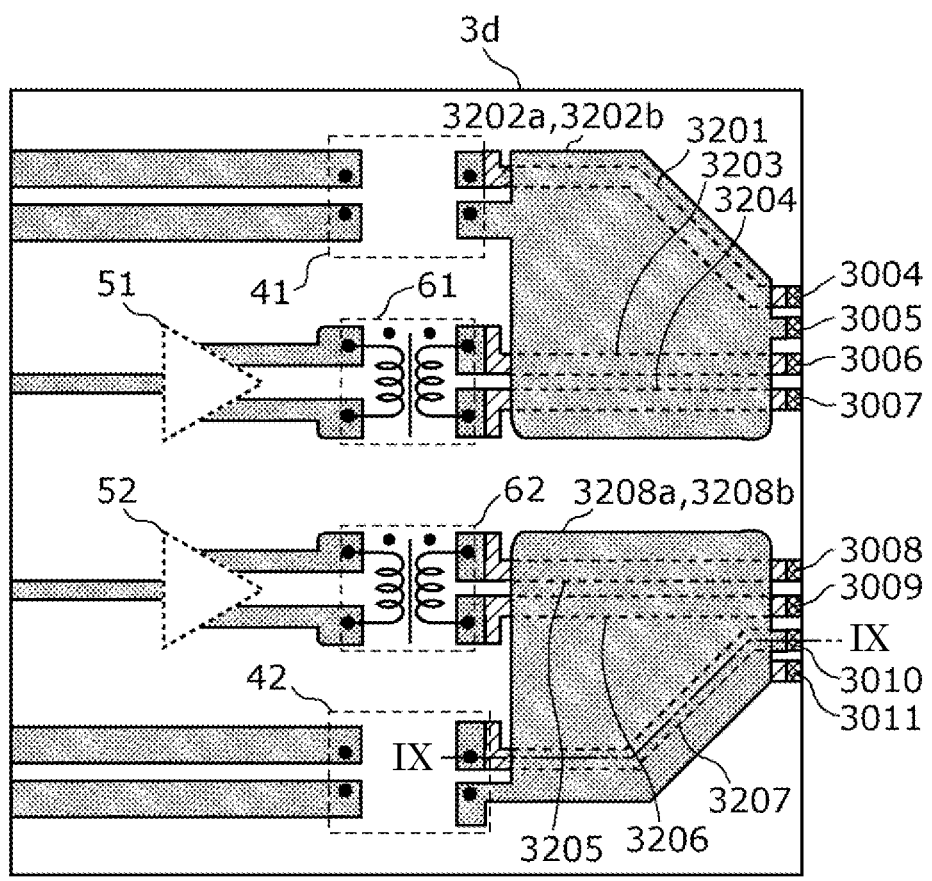
FIG. 8 is a schematic diagram illustrating a physical configuration example of a control board according to a fifth exemplary embodiment.
Figure 9:
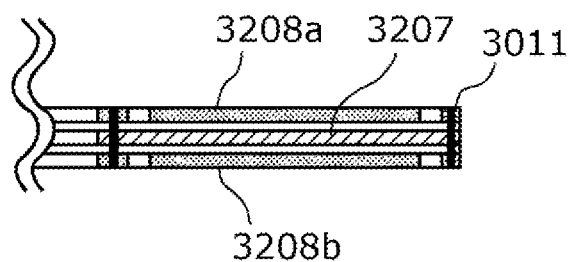
FIG. 9 is an enlarged cross-sectional view of the control board according to the fifth exemplary embodiment.

FIG. 8 is a schematic diagram illustrating a physical configuration example of control board 3d according to the fifth exemplary embodiment. FIG. 9 is an enlarged cross-sectional view of control board 3d when control board 3d is cut along line IX-IX in FIG. 8.

As illustrated in FIG. 9, control board 3d is a multilayer (here, three-layer) circuit board capable of forming wiring patterns on a surface, an inner layer, and a back surface.

As illustrated in FIGS. 8 and 9, wiring pattern 3201, wiring pattern 3203, wiring pattern 3204, wiring pattern 3205, wiring pattern 3206, and wiring pattern 3207 are disposed in the inner layer of control board 3d. Wiring pattern 3201 connects first isolated power supply circuit 41 and first power supply terminal 3004. Wiring pattern 3203 connects first isolation signal converter 61 and first drive signal terminal 3006. Wiring pattern 3204 connects first isolation signal converter 61 and first drive signal terminal 3007. Wiring pattern 3207 connects second isolated power supply circuit 42 and second power supply terminal 3010. Wiring pattern 3205 connects second isolation signal converter 62 and second drive signal terminal 3008. Wiring pattern 3206 connects second isolation signal converter 62 and second drive signal terminal 3009.

Further, wiring pattern 3202a, wiring pattern 3202b, wiring pattern 3208a, and wiring pattern 3208b are formed on the surface and the back surface of control board 3d. Wiring pattern 3202a and wiring pattern 3202b are wiring patterns that connect first isolated power supply circuit 41 and first common terminal 3005. Furthermore, wiring pattern 3202a and wiring pattern 3202b are formed so as to sandwich wiring pattern 3201, wiring pattern 3203, and wiring pattern 3204 from a side of the surface and a side of the back surface. Wiring pattern 3208a and wiring pattern 3208b are wiring patterns that connect second isolated power supply circuit 42 and second common terminal 3011. Wiring pattern 3208a and wiring pattern 3208b are formed so as to sandwich wiring pattern 3205, wiring pattern 3206, and wiring pattern 3207 from the side of the surface and the side of the back surface.

With the configuration of control board 3d, wiring pattern 3202a and wiring pattern 3202b function as a shield structure that shields at least a part of wiring pattern 3201, wiring pattern 3203, and wiring pattern 3204. As a result, the influence of external noise (for example, high-frequency switching noise) on wiring pattern 3201, wiring pattern 3203, and wiring pattern 3204 is reduced. Further, wiring pattern 3208a and wiring pattern 3208b function as a shield structure that shields at least a part of wiring pattern 3205, wiring pattern 3206, and wiring pattern 3207. As a result, the influence of external noise (for example, high-frequency switching noise) on wiring pattern 3205, wiring pattern 3206, and wiring pattern 3207 is reduced.

Therefore, according to the class-D power converter according to the fifth exemplary embodiment, malfunction due to the external noise is suppressed, and stable switching operation without malfunction can be performed.

Supplementary

As described above, the first to fifth exemplary embodiments have been described as examples of the techniques disclosed in the present application. However, the techniques according to the present disclosure are not limited thereto, and are also applicable to exemplary embodiments in which changes, replacements, additions, omissions, and the like are made as appropriate without departing from the gist of the present disclosure.

The present disclosure is widely applicable to a class-D power converter.

The invention claimed is:
1. A class-D power converter comprising:
a switch circuit including a first semiconductor element and a second semiconductor element connected in series with each other and receiving a DC voltage of 100 V or more;
a drive circuit that causes the first semiconductor element or the second semiconductor element to perform a switching operation;
an isolated power supply circuit that receives a predetermined power supply voltage, converts the predetermined power supply voltage into a first power supply voltage isolated from the predetermined power supply voltage, and outputs the first power supply voltage to the drive circuit;
an isolation signal converter that receives a first signal of 6 MHz or more, converts the first signal into a first drive signal isolated from the first signal, and outputs the first drive signal to the drive circuit; and
a single substrate on which the isolated power supply circuit and the isolation signal converter are mounted, wherein the first semiconductor element and the second semiconductor element are wide bandgap semiconductor elements,
a potential of a connection point between the first semiconductor element and the second semiconductor element is changed at a maximum speed of 50 V/ns or more, and
the connection point outputs an AC voltage having a power of 1 kW or more.

2. The class-D power converter according to claim 1, wherein the drive circuit is further mounted on the single substrate.

3. The class-D power converter according to claim 1, wherein
the drive circuit includes:
a first drive circuit that causes the first semiconductor element to perform a switching operation; and
a second drive circuit that causes the second semiconductor element to perform a switching operation,
the isolated power supply circuit includes:
a first isolated power supply circuit that receives the predetermined power supply voltage, converts the predetermined power supply voltage into the first power supply voltage, and outputs the first power supply voltage to the first drive circuit; and
a second isolated power supply circuit that receives the predetermined power supply voltage, converts the predetermined power supply voltage into a second power supply voltage isolated from the predetermined power supply voltage, and outputs the second power supply voltage to the second drive circuit,
the isolation signal converter includes:
a first isolation signal converter that receives the first signal, converts the first signal into the first drive signal, and outputs the first drive signal to the first drive circuit; and
a second isolation signal converter that receives a second signal of 6 MHz or more, converts the second signal into a second drive signal isolated from the second signal, and outputs the second drive signal to the second drive circuit, and
a wiring path that transmits the first power supply voltage from the first isolated power supply circuit to the first drive circuit is less than or equal to 5 cm.

4. A class-D power converter comprising:
a switch circuit including a first semiconductor element and a second semiconductor element connected in series with each other and receiving a DC voltage of 100 V or more;
a drive circuit that causes the first semiconductor element or the second semiconductor element to perform a switching operation;
an isolated power supply circuit that receives a predetermined power supply voltage, converts the predetermined power supply voltage into a first power supply voltage isolated from the predetermined power supply voltage, and outputs the first power supply voltage to the drive circuit; and
an isolation signal converter that receives a first signal of 6 MHz or more, converts the first signal into a first drive signal isolated from the first signal, and outputs the first drive signal to the drive circuit, wherein
the drive circuit includes:
a first drive circuit that causes the first semiconductor element to perform a switching operation; and
a second drive circuit that causes the second semiconductor element to perform a switching operation, the isolated power supply circuit includes:
a first isolated power supply circuit that receives the predetermined power supply voltage, converts the predetermined power supply voltage into the first power supply voltage, and outputs the first power supply voltage to the first drive circuit; and
a second isolated power supply circuit that receives the predetermined power supply voltage, converts the predetermined power supply voltage into a second power supply voltage isolated from the predetermined power supply voltage, and outputs the second power supply voltage to the second drive circuit,
the isolation signal converter includes:
a first isolation signal converter that receives the first signal, converts the first signal into the first drive signal, and outputs the first drive signal to the first drive circuit; and
a second isolation signal converter that receives a second signal of 6 MHz or more, converts the second signal into a second drive signal isolated from the second signal, and outputs the second drive signal to the second drive circuit,
a wiring path that transmits the first power supply voltage from the first isolated power supply circuit to the first drive circuit is less than or equal to 5 cm,
the first semiconductor element and the second semiconductor element are wide bandgap semiconductor elements,
a potential of a connection point between the first semiconductor element and the second semiconductor element is changed at a maximum speed of 50 V/ns or more, and
an AC voltage having a power of 1 kW or more is output from the connection point.

5. The class-D power converter according to claim 3, wherein the first isolated power supply circuit, the second isolated power supply circuit, the first isolation signal converter, and the second isolation signal converter are linearly arranged.

6. The class-D power converter according to claim 1, wherein the isolated power supply circuit does not receive a feedback signal from an output side.

7. The class-D power converter according to claim 1, wherein the isolated power supply circuit includes an output voltage variable circuit that sets a potential of the first power supply voltage.

8. The class-D power converter according to claim 1, further comprising a noise elimination circuit in a path that transmits the first power supply voltage between the isolated power supply circuit and the drive circuit.

9. The class-D power converter according to claim 8, wherein the noise elimination circuit includes a rectifier element and a resistive element connected in series with each other in the path.

10. The class-D power converter according to claim 8, wherein the noise elimination circuit includes a bypass capacitor in the path.

11. The class-D power converter according to claim 1, further comprising a shield structure that shields at least a part of a wiring that transmits the first power supply voltage between the isolated power supply circuit and the drive circuit.

12. The class-D power converter according to claim 4, wherein the first isolated power supply circuit, the second isolated power supply circuit, the first isolation signal converter, and the second isolation signal converter are linearly arranged.

13. The class-D power converter according to claim 4, wherein the isolated power supply circuit does not receive a feedback signal from an output side.

14. The class-D power converter according to claim 4, wherein the isolated power supply circuit includes an output voltage variable circuit that sets a potential of the first power supply voltage.

15. The class-D power converter according to claim 4, further comprising a noise elimination circuit in a path that transmits the first power supply voltage between the isolated power supply circuit and the drive circuit.

16. The class-D power converter according to claim 15, wherein the noise elimination circuit includes a rectifier element and a resistive element connected in series with each other in the path.

17. The class-D power converter according to claim 15, wherein the noise elimination circuit includes a bypass capacitor in the path.

18. The class-D power converter according to claim 4, further comprising a shield structure that shields at least a part of a wiring that transmits the first power supply voltage between the isolated power supply circuit and the drive circuit.

* * * * *